United States Patent
Ko et al.

(10) Patent No.: US 8,279,702 B2
(45) Date of Patent: Oct. 2, 2012

(54) SEMICONDUCTOR APPARATUS

(75) Inventors: Jae Bum Ko, Ichon-si (KR); Sang Jin Byeon, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 251 days.

(21) Appl. No.: 12/840,966

(22) Filed: Jul. 21, 2010

(65) Prior Publication Data

US 2011/0267137 A1    Nov. 3, 2011

(30) Foreign Application Priority Data

Apr. 30, 2010    (KR) .................. 10-2010-0040612

(51) Int. Cl.
    *G11C 8/00*    (2006.01)

(52) U.S. Cl. .............. 365/230.03; 365/201; 365/230.01

(58) Field of Classification Search .................. 365/201, 365/230.01, 230.03
    See application file for complete search history.

(56) References Cited

U.S. PATENT DOCUMENTS

| | | | |
|---|---|---|---|
| 6,798,679 B2 * | 9/2004 | Matsumoto et al. | 365/52 |
| 7,317,256 B2 | 1/2008 | Williams et al. | |
| 7,477,545 B2 * | 1/2009 | Tu et al. | 365/185.05 |
| 7,529,143 B2 * | 5/2009 | Sakuragi | 365/200 |
| 7,598,523 B2 | 10/2009 | Luo et al. | |
| 7,715,255 B2 * | 5/2010 | Tu et al. | 365/195 |
| 2003/0218216 A1 * | 11/2003 | Matsumoto et al. | 257/365 |
| 2005/0030815 A1 * | 2/2005 | Matsumoto et al. | 365/222 |
| 2007/0280013 A1 * | 12/2007 | Sakuragi | 365/200 |
| 2008/0310242 A1 * | 12/2008 | Tu et al. | 365/200 |
| 2008/0311684 A1 * | 12/2008 | Tu et al. | 438/4 |
| 2008/0315388 A1 | 12/2008 | Periaman et al. | |
| 2009/0020865 A1 | 1/2009 | Su | |
| 2009/0134500 A1 | 5/2009 | Kuo | |
| 2009/0166873 A1 | 7/2009 | Yang et al. | |
| 2009/0213634 A1 * | 8/2009 | Shibata | 365/51 |
| 2010/0002512 A1 * | 1/2010 | Cornwell et al. | 365/185.09 |

FOREIGN PATENT DOCUMENTS

| | | |
|---|---|---|
| KR | 100274105 B1 | 9/2000 |
| KR | 1020100040288 A | 4/2010 |

\* cited by examiner

*Primary Examiner* — Huan Hoang
*Assistant Examiner* — Jay Radke
(74) *Attorney, Agent, or Firm* — William Park & Associates Ltd.

(57) ABSTRACT

A semiconductor apparatus includes an individual-chip-designating-code setting block configured to generate a plurality of sets of individual-chip-designating-codes which have different code values or in which at least two sets of individual-chip-designating-codes have the same code value, in response to a plurality of chip fuse signals; a control block configured to generate a plurality of enable control signals in response to the plurality of chip fuse signals and most significant bits of the plurality of sets of individual-chip-designating-codes; and an individual chip activation block configured to compare individual-chip-designating-codes of the plurality of sets of individual-chip-designating-codes excluding the most significant bits, with chip selection addresses in response to the plurality of enable control signals, and enable one of a plurality of individual-chip-activation-signals depending upon a comparison result.

22 Claims, 7 Drawing Sheets

SEMICONDUCTOR APPARATUS

CROSS-REFERENCES TO RELATED APPLICATION

The present application claims priority under 35 U.S.C. §119(a) to Korean Application No. 10-2010-0040612, filed on Apr. 30, 2010, in the Korean Intellectual Property Office, which is incorporated herein by reference in its entirety as if set forth in full.

BACKGROUND

1. Technical Field

The present invention relates to a semiconductor integrated circuit, and more particularly, to a semiconductor apparatus with a plurality of individual stacked chips.

2. Related Art

A semiconductor apparatus is designed to operate at a high speed and to have a data storage area of a large capacity.

In order to meet such trends, a technology has been developed for producing a single product by stacking individual wafer chips and packaging them.

Generally, the stacked individual chips are assigned with addresses, and data are stored in the chips according to the assigned addresses.

To assign addresses to the stacked individual chips, the value of a code having a plurality of bits is sequentially increased or decreased.

Such technology for stacking individual chips and assigning to each individual chip as its address the value of a code sequentially increased or decreased is used on the assumption that none of the individual chips has failed.

In fact, if just one of the stacked individual chips fails, none of the stacked individual chips can be used. For example, if failure occurs in just one of the stacked individual chips in a semiconductor apparatus packaged with eight stacked layers, none of the remaining seven non-failed chips can be used. In this regard, the conventional art lacks efficiency and productivity.

SUMMARY

Accordingly, various exemplary embodiments of the invention may provide a semiconductor apparatus in which a plurality of individual chips are stacked and which can replace a failed chip with an extra chip when at least one of the stacked individual chips has failed.

In one embodiment of the present invention, a semiconductor apparatus includes: an individual-chip-designating-code setting block configured to generate a plurality of sets of individual-chip-designating-codes, wherein each set of codes has a different code value or at least two sets of codes have the same code value, in response to a plurality of chip fuse signals; a control block configured to generate a plurality of enable control signals in response to the plurality of chip fuse signals and most significant bits of each of the plurality of sets of individual-chip-designating-codes; and an individual chip activation block configured to compare individual-chip-designating-codes of the plurality of sets of individual-chip-designating-codes excluding the most significant bits with chip selection addresses in response to the plurality of enable control signals, and enable one of a plurality of individual-chip-activation-signals depending upon a comparison result.

In another embodiment of the present invention, a semiconductor apparatus suitable for generating a first set of individual-chip-designating-codes, a second set of individual-chip-designating-codes, a third set of individual-chip-designating-codes, a fourth set of individual-chip-designating-codes, a first individual-chip-activation-signal, a second individual-chip-activation-signal, a third individual-chip-activation-signal and a fourth individual-chip-activation-signal, comparing the first through third sets of individual-chip-designating-codes with chip selection addresses when a chip fuse signal is enabled, and enabling one of the first through third individual-chip-activation-signals includes: an individual-chip-designating-code setting block configured to generate the second set of individual-chip-designating-codes to have the same code value as the first set of individual-chip-designating-codes when the chip fuse signal is disabled; and an individual chip activation block configured to compare the first set of individual-chip-designating-codes, the third set of individual-chip-designating-codes and the fourth set of individual-chip-designating-codes with the chip selection addresses when the individual-chip-designating-code setting block generates the second set of individual-chip-designating-codes to have the same code value as the first set of individual-chip-designating-codes, and enable one of the first individual-chip-activation-signal, the third individual-chip-activation-signal and the fourth individual-chip-activation-signal.

BRIEF DESCRIPTION OF THE DRAWINGS

Features, aspects, and embodiments are described in conjunction with the attached drawings, in which.

DETAILED DESCRIPTION

A semiconductor apparatus according to the present invention is described below with reference to the accompanying drawings through exemplary embodiments.

Figure 1:
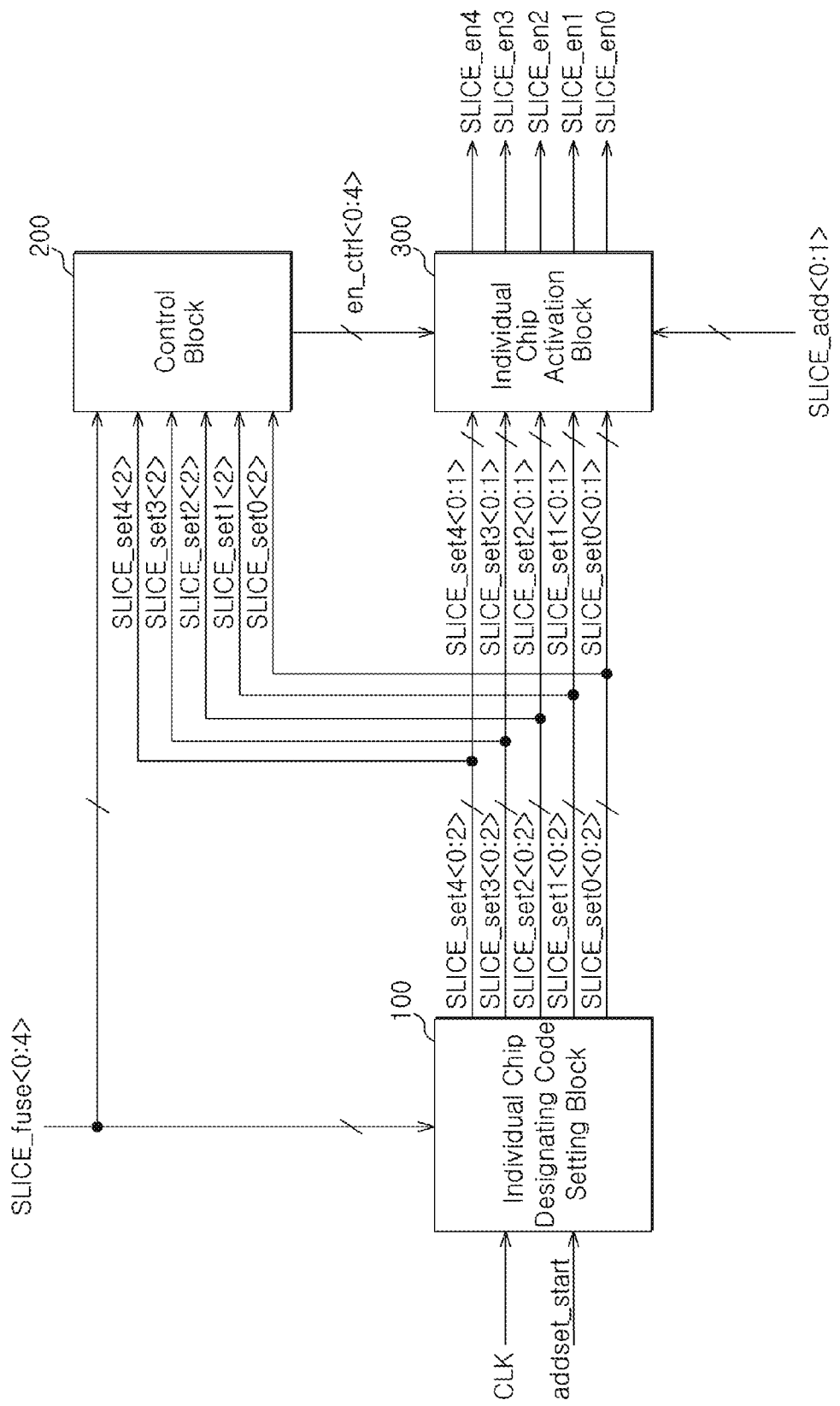
FIG. 1 is a diagram illustrating the configuration of a semiconductor apparatus in accordance with an embodiment of the present invention.

Referring to FIG. 1, a semiconductor apparatus in accordance with an embodiment of the present invention includes an individual-chip-designating-code setting block 100, a control block 200, and an individual chip activation block 300.

The individual-chip-designating-code setting block 100 is configured to generate first through fifth sets of individual-chip-designating-codes SLICE_set0<0:2>, SLICE_set1<0:2>, SLICE_set2<0:2>, SLICE_set3<0:2> and SLICE_set4<0:2>, which have different code values or of which at least two sets of codes have the same code value, in response to first through fifth chip fuse signals SLICE_fuse<0:4>. The individual-chip-designating-code setting block 100 is configured in such a manner that each of the code values of the first through fifth individual-chip-designating-codes SLICE_set0<0:2>, SLICE_set1<0:2>, SLICE_set2<0:2>, SLICE_set3<0:2> and SLICE_set4<0:2> sequentially increases when the first through fifth chip fuse signals SLICE_fuse<0:4> are all enabled. Also, the individual-chip-designating-code setting block 100 is configured to determine the number of sets of individual-chip-designating-codes which have the same code value, in response to a disabled chip fuse signal among the first through fifth chip fuse signals SLICE_fuse<0:4>. For example, the individual-chip-designating-code setting block 100 initializes the first individual-chip-designating-codes SLICE_set0<0:2> when the first chip fuse signal SLICE_fuse<0> is disabled. The individual-chip-designating-code setting block 100 generates the second individual-chip-designating-codes SLICE_set1<0:2> which have the same code value as the first individual-chip-designating-codes SLICE_set0<0:2>, when the second chip fuse signal SLICE_fuse<1> is disabled. The individual-chip-designating-code setting block 100 generates the third individual-chip-designating-codes SLICE_set2<0:2> which have the same code value as the second individual-chip-designating-codes SLICE_set1<0:2>, when the third chip fuse signal SLICE_fuse<2> is disabled. The individual-chip-designating-code setting block 100 generates the fourth individual-chip-designating-codes SLICE_set3<0:2> which have the same code value as the third individual-chip-designating-codes SLICE_set2<0:2>, when the fourth chip fuse signal SLICE_fuse<3> is disabled. The individual-chip-designating-code setting block 100 generates the fifth individual-chip-designating-codes SLICE_set4<0:2> which have the same code value as the fourth individual-chip-designating-codes SLICE_set3<0:2>, when the fifth chip fuse signal SLICE_fuse<4> is disabled.

The control block 200 is configured to generate first through fifth enable control signals en_ctrl<0:4> in response to the first through fifth chip fuse signals SLICE_fuse<0:4> and most significant bits SLICE_set0<2>, SLICE_set1<2>, SLICE_set2<2>, SLICE_set3<2> and SLICE_set4<2> of the first through fifth individual-chip-designating-codes SLICE_set0<0:2>, SLICE_set1<0:2>, SLICE_set2<0:2>, SLICE_set3<0:2> and SLICE_set4<0:2>.

The individual chip activation block 300 is configured to compare the codes SLICE_set0<0:1>, SLICE_set1<0:1>, SLICE_set2<0:1>, SLICE_set3<0:1> and SLICE_set4<0:1> of the first through fifth individual-chip-designating-codes SLICE_set0<0:2>, SLICE_set1<0:2>, SLICE_set2<0:2>, SLICE_set3<0:2> and SLICE_set4<0:2> excluding the most significant bits SLICE_set0<2>, SLICE_set1<2>, SLICE_set2<2>, SLICE_set3<2> and SLICE_set4<2>, with chip selection addresses SLICE_add<0:1> in response to the first through fifth enable control signals en_ctrl<0:4>, and enable one of first through fifth individual-chip-activation-signals SLICE_en0 through SLICE_en4 depending upon a comparison result.

Figure 2:
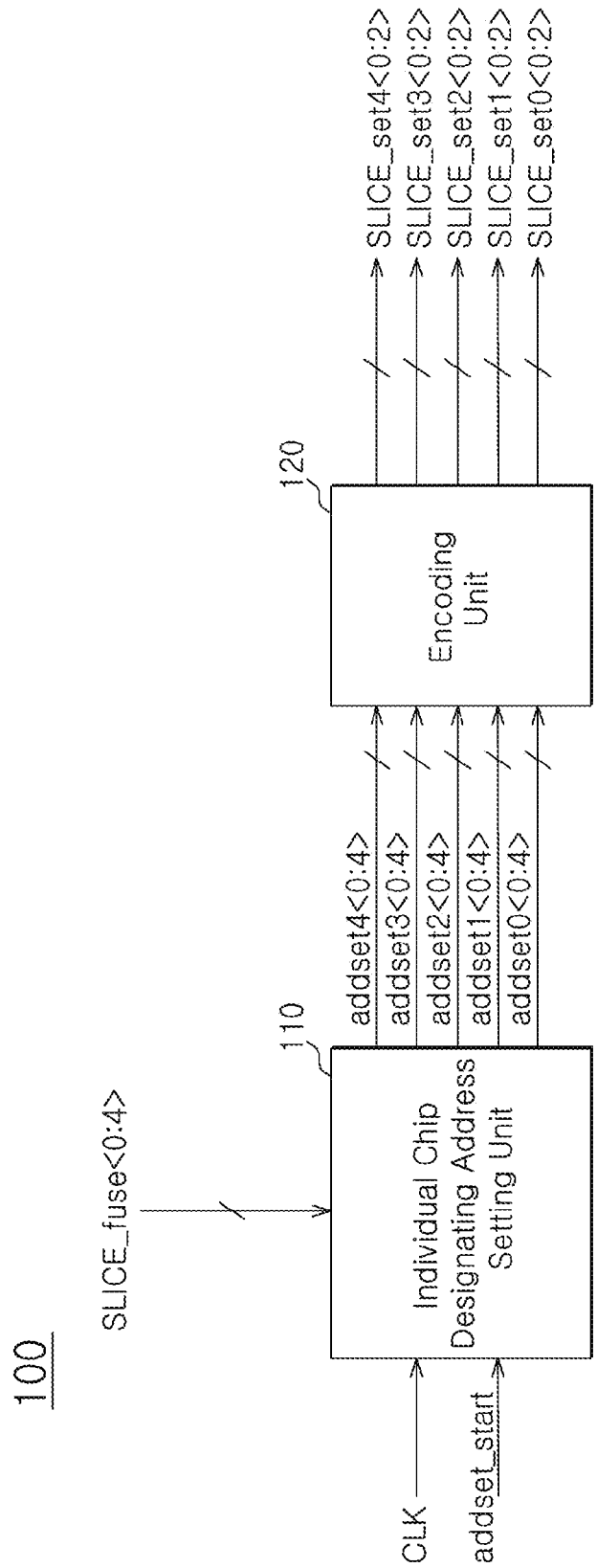
FIG. 2 is a diagram illustrating the configuration of the individual-chip-designating-code setting block shown in FIG. 1.

Referring to FIG. 2, the individual-chip-designating-code setting block 100 includes an individual-chip-designating-address setting unit 110 and an encoding unit 120.

The individual-chip-designating-address setting unit 110 is configured to generate first through fifth sets of designating addresses addset0<0:4>, addset1<0:4>, addset2<0:4>, addset3<0:4> and addset4<0:4> in response to the first through fifth chip fuse signals SLICE_fuse<0:4>. For example, the individual-chip-designating-address setting unit 110 generates the first through fifth sets of designating addresses addset0<0:4>, addset1<0:4>, addset2<0:4>, addset3<0:4> and addset4<0:4> having different values, when the first through fifth chip fuse signals SLICE_fuse<0:4> are all enabled. The individual-chip-designating-address setting unit 110 initializes the first set of designating addresses addset0<0:4> when the first chip fuse signal SLICE_fuse<0> is disabled, and generates the second set of designating addresses addset1<0:4> which has the same value as the first set of designating codes addset0<0:4>, when the second chip fuse signal SLICE_fuse<1> is disabled. The individual-chip-designating-address setting unit 110 generates the third set of designating addresses addset2<0:4>, which has the same value as the second set of designating codes addset1<0:4>, when the third chip fuse signal SLICE_fuse<2> is disabled; generates the fourth set of designating addresses addset3<0:4>, which has the same value as the third set of designating codes addset2<0:4>, when the fourth is chip fuse signal SLICE_fuse<3> is disabled; and generates the fifth set of designating addresses addset4<0:4>, which has the same value as the fourth set of designating codes addset3<0:4>, when the fifth chip fuse signal SLICE_fuse<4> is disabled.

The encoding unit 120 is configured to encode the first through fifth sets of designating addresses addset0<0:4>, addset1<0:4>, addset2<0:4>, addset3<0:4> and addset4<0:4> and to generate the first through fifth individual-chip-designating-codes SLICE_set0<0:2>, SLICE_set1<0:2>, SLICE_set2<0:2>, SLICE_set3<0:2> and SLICE_set4<0:2>.

Figure 3:
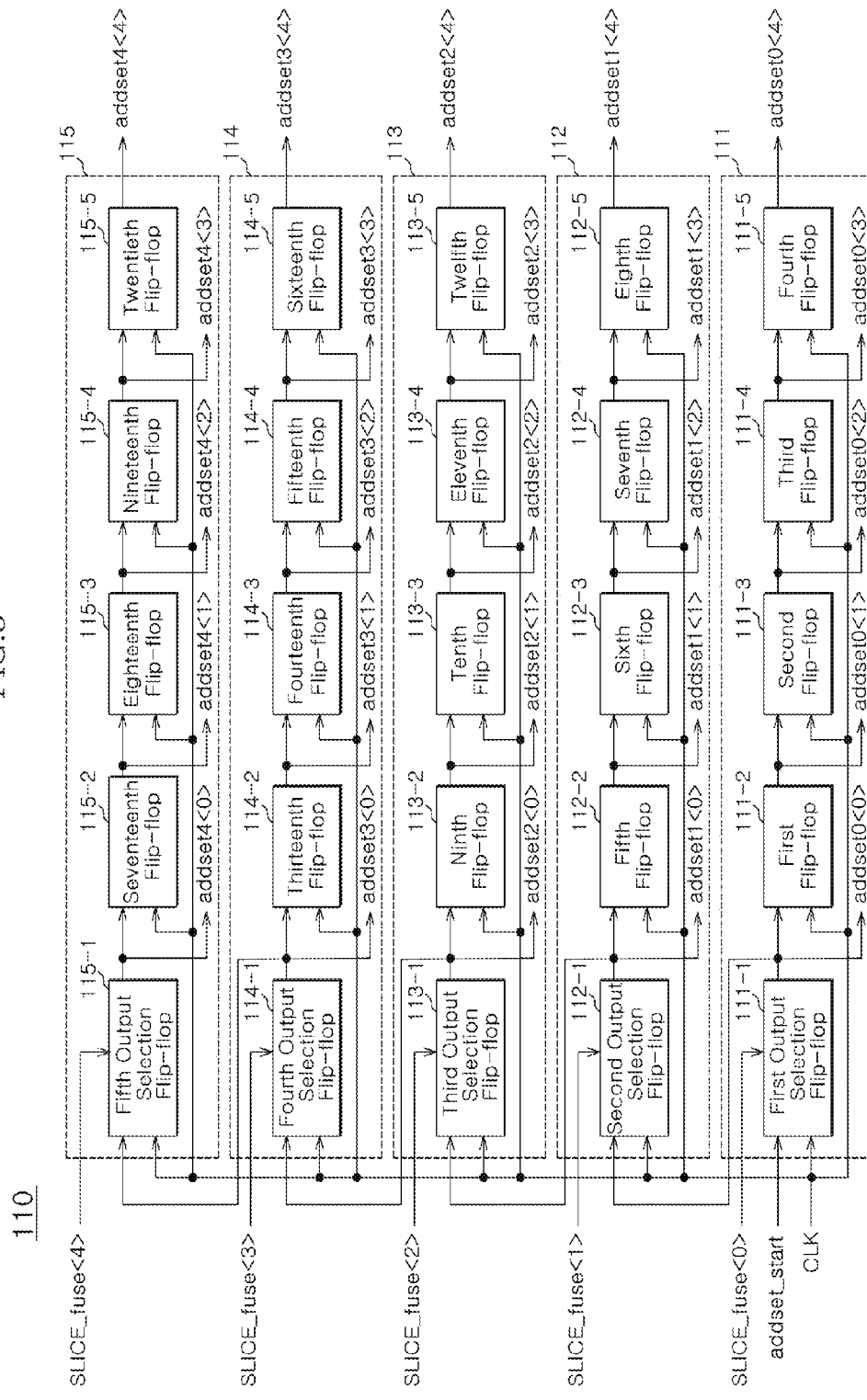
FIG. 3 is a diagram illustrating the configuration of the individual-chip-designating-address setting unit shown in FIG. 2.

Referring to FIG. 3, the individual-chip-designating-address setting unit 110 includes first through fifth designating-address-set-generation-sections 111 through 115.

The first designating-address-set-generation-section 111 is configured to generate the first set of designating addresses addset0<0:4> in response to the first chip fuse signal SLICE_fuse<0>.

The first designating-address-set-generation-section 111 includes a first output selection flip-flop 111-1 and first through fourth flip-flops 111-2 through 111-5.

The first output selection flip-flop 111-1 outputs an address-setting-start-pulse addset_start as the first designating address addset0<0> of the first set of designating addresses addset0<0:4> when the first chip fuse signal SLICE_fuse<0> is disabled, or outputs the address-setting-start-pulse addset_start as the first designating is address addset0<0> of the first set of designating addresses addset0<0:4> after one cycle of a clock CLK when the first chip fuse signal SLICE_fuse<0> is enabled.

The first flip-flop 111-2 receives the output of the first output selection flip-flop 111-1 and outputs the received output as the second designating address addset0<1> of the first set of designating addresses addset0<0:4> after one cycle of the clock CLK.

The second flip-flop 111-3 receives the output of the first flip-flop 111-2 and outputs the received output as the third designating address addset0<2> of the first set of designating addresses addset0<0:4> after one cycle of the clock CLK.

The third flip-flop 111-4 receives the output of the second flip-flop 111-3 and outputs the received output as the fourth designating address addset0<3> of the first set of designating addresses addset0<0:4> after one cycle of the clock CLK.

The fourth flip-flop 111-5 receives the output of the third flip-flop 111-4 and outputs the received output as the fifth designating address addset0<4> of the first set of designating addresses addset0<0:4> after one cycle of the clock CLK.

The second designating-address-set-generation-section 112 to is configured to generate the second set of designating addresses addset1<0:4> in response to the second chip fuse signal SLICE_fuse<1>.

The second designating-address-set-generation-section 112 includes a second output selection flip-flop 112-1 and fifth through eighth flip-flops 112-2 through 112-5.

The second output selection flip-flop 112-1 outputs the output of the first output selection flip-flop 111-1 as the first designating address addset1<0> of the second set of designating addresses addset1<0:4> when the second chip fuse signal SLICE_fuse<1> is disabled, or outputs the output of the first output selection flip-flop 111-1 as the first designating address addset1<0> of the second set of designating addresses addset1<0:4> after one cycle of the clock CLK when the second chip fuse signal SLICE_fuse<1> is enabled.

The fifth flip-flop 112-2 outputs the output of the second output selection flip-flop 112-1 as the second designating address addset1<1> of the second set of designating addresses addset1<0:4> after one cycle of the clock CLK.

The sixth flip-flop 112-3 outputs the output of the fifth flip-flop 112-2 as the third designating address addset1<2> of the second set of designating addresses addset1<0:4> after one cycle of the clock CLK.

The seventh flip-flop 112-4 outputs the output of the sixth flip-flop 112-3 as the fourth designating address addset1<3> of the to second set of designating addresses addset1<0:4> after one cycle of the clock CLK.

The eighth flip-flop 112-5 outputs the output of the seventh flip-flop 112-4 as the fifth designating address addset1<4> of the second set of designating addresses addset1<0:4> after one cycle of the clock CLK.

The third designating-address-set-generation-section 113 is configured to generate the third set of designating addresses addset2<0:4> in response to the third chip fuse signal SLICE_fuse<2>.

The third designating-address-set-generation-section 113 includes a third output selection flip-flop 113-1 and ninth through twelfth flip-flops 113-2 through 113-5.

The third output selection flip-flop 113-1 outputs the output of the second output selection flip-flop 112-1 as the first designating address addset2<0> of the third set of designating addresses addset2<0:4> when the third chip fuse signal SLICE_fuse<2> is disabled, or outputs the output of the second output selection flip-flop 112-1 as the first designating address addset2<0> of the third set of designating addresses addset2<0:4> after one cycle of the clock CLK when the third chip fuse signal SLICE_fuse<2> is enabled.

The ninth flip-flop 113-2 outputs the output of the third output selection flip-flop 113-1 as the second designating address addset2<1> of the third set of designating addresses addset2<0:4> after one cycle of the clock CLK.

The tenth flip-flop 113-3 outputs the output of the ninth flip-flop 113-2 as the third designating address addset2<2> of the third set of designating addresses addset2<0:4> after one cycle of the clock CLK.

The eleventh flip-flop 113-4 outputs the output of the tenth is flip-flop 113-3 as the fourth designating address addset2<3> of the third set of designating addresses addset2<0:4> after one cycle of the clock CLK.

The twelfth flip-flop 113-5 outputs the output of the eleventh flip-flop 113-4 as the fifth designating address addset2<4> of the third set of designating addresses addset2<0:4> after one cycle of the clock CLK.

The fourth designating-address-set-generation-section 114 is configured to generate the fourth set of designating addresses addset3<0:4> in response to the fourth chip fuse signal SLICE_fuse<3>.

The fourth designating-address-set-generation-section 114 includes a fourth output selection flip-flop 114-1 and thirteenth through sixteenth flip-flops 114-2 through 114-5.

The fourth output selection flip-flop 114-1 outputs the output of the third output selection flip-flop 113-1 as the first designating address addset3<0> of the fourth set of designating addresses addset3<0:4> when the fourth chip fuse signal SLICE_fuse<3> is disabled, or outputs the output of the third output selection flip-flop 113-1 as the first designating address addset3<0> of the fourth set of designating addresses addset3<0:4> after one cycle of the clock CLK when the fourth chip fuse signal SLICE_fuse<3> is enabled.

The thirteenth flip-flop 114-2 outputs the output of the fourth output selection flip-flop 114-1 as the second designating is address addset3<1> of the fourth set of designating addresses addset3<0:4> after one cycle of the clock CLK.

The fourteenth flip-flop 114-3 outputs the output of the thirteenth flip-flop 114-2 as the third designating address addset3<2> of the fourth set of designating addresses addset3<0:4> after one cycle of the clock CLK.

The fifteenth flip-flop 114-4 outputs the output of the fourteenth flip-flop 114-3 as the fourth designating address addset3<3> of the fourth set of designating addresses addset3<0:4> after one cycle of the clock CLK.

The sixteenth flip-flop 114-5 outputs the output of the fifteenth flip-flop 114-4 as the fifth designating address addset3<4> of the fourth set of designating addresses addset3<0:4> after one cycle of the clock CLK.

The fifth designating-address-set-generation-section 115 is configured to generate the fifth set of designating addresses addset4<0:4> in response to the fifth chip fuse signal SLICE_fuse<4>.

The fifth designating-address-set-generation-section 115 includes a fifth output selection flip-flop 115-1 and seventeenth through twentieth flip-flops 115-2 through 115-5.

The fifth output selection flip-flop 115-1 outputs the output of the fourth output selection flip-flop 114-1 as the first designating address addset4<0> of the fifth set of designating addresses addset4<0:4> when the fifth chip fuse signal SLICE_fuse<4> is disabled, or outputs the output of the fourth output selection flip-flop 114-1 as the first designating address addset4<0> of the fifth set of designating addresses addset4<0:4> after one cycle of the clock CLK when the fifth chip fuse signal SLICE_fuse<4> is enabled.

The seventeenth flip-flop 115-2 outputs the output of the fifth output selection flip-flop 115-1 as the second designating address addset4<1> of the fifth set of designating addresses addset4<0:4> after one cycle of the clock CLK.

The eighteenth flip-flop 115-3 outputs the output of the seventeenth flip-flop 115-2 as the third designating address addset4<2> of the fifth set of designating addresses addset4<0:4> after one cycle of the clock CLK.

The nineteenth flip-flop 115-4 outputs the output of the eighteenth flip-flop 115-3 as the fourth designating address addset4<3> of the fifth set of designating addresses addset4<0:4> after one cycle of the clock CLK.

The twentieth flip-flop 115-5 outputs the output of the nineteenth flip-flop 115-4 as the fifth designating address addset4<4> of the fifth set of designating addresses addset4<0:4> after one cycle of the clock CLK.

Since the internal configurations of the first through fifth output selection flip-flops 111-1, 112-1, 113-1, 114-1 and 115-1 are the same, only the configuration of the first output selection flip-flop 111-1 is described below.

Figure 4:
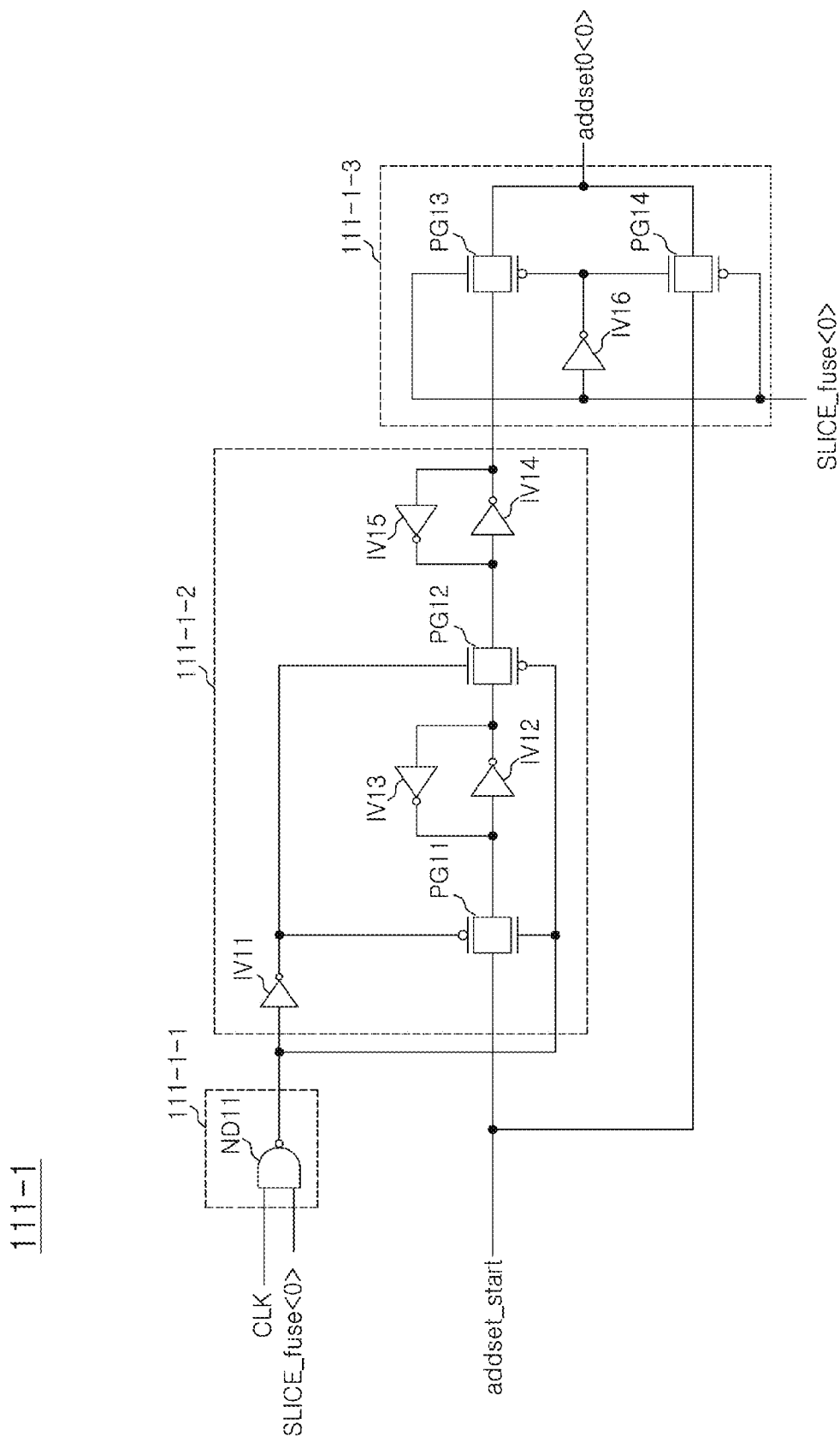
FIG. 4 is a diagram illustrating the configuration of the first output selecting flip-flop shown in FIG. 3.

Referring to FIG. 4, the first output selection flip-flop 111-1 is includes a clock control part 111-1-1, a flip-flop part 111-1-2, and a multiplexer 111-1-3.

The clock control part 111-1-1 is configured to invert and output the clock CLK when the first chip fuse signal SLICE_fuse<0> is enabled to a high level, and to output a signal fixed at a high level regardless of the clock CLK when the first chip fuse signal SLICE_fuse<0> is disabled to a low level.

The clock control part 111-1-1 includes a NAND gate ND11. The NAND gate ND11 receives the clock CLK and the first chip fuse signal SLICE_fuse<0>, and the output of the NAND gate ND11 is provided to the flip-flop part 111-1-2.

The flip-flop part 111-1-2 is configured to receive and store the address-setting-start-pulse addset_start when the output of the clock control part 111-1-1 is a high level, and to output the stored signal when the output of the clock control part 111-1-1 is a low level.

The flip-flop part 111-1-2 includes first through fifth inverters IV11 through IV15, and first and second pass gates PG11 and PG12. The first inverter IV11 receives the output signal of the NAND gate ND11. The first pass gate PG11 receives the output signal of the first inverter IV11 at the first control terminal, the output signal of the NAND gate ND11 at the second control terminal, and the address-setting-start-pulse addset_start at the input terminal. The second inverter IV12 receives the output signal of the first pass gate PG11. The third inverter IV13 receives the output signal of the second inverter IV12 at the input terminal and provides its output as is an input to the second inverter IV12. The second pass gate PG12 receives the output signal of the first inverter IV11 at the first control terminal, the output signal of the NAND gate ND11 at the second control thereof, and the output signal of the second inverter IV12 at the input terminal. The fourth inverter IV14 receives the output signal of the second pass gate PG12. The fifth inverter IV15 receives the output signal of the fourth inverter IV14 and provides its output as an input to the fourth inverter IV14.

The multiplexer 111-1-3 is configured to output the output of the flip-flop part 111-1-2 as the first designating address addset0<0> of the first set of designating addresses addset0<0:4> when the first chip fuse signal SLICE_fuse<0> is enabled to the high level, and to output the address-setting-start-pulse addset_start as the first designating address addset0<0> of the first set of designating addresses addset0<0:4> when the first chip fuse signal SLICE_fuse<0> is disabled to the low level.

The multiplexer 111-1-3 includes a sixth inverter IV16, and third and fourth pass gates PG13 and PG14. The sixth inverter IV16 receives the first chip fuse signal SLICE_fuse<0>. The third pass gate PG13 receives the first chip fuse signal SLICE_fuse<0> at the first control terminal, the output signal of the sixth inverter IV16 at the second control terminal, and the output signal of the flip-flop 111-1-2 at the input terminal. The fourth pass gate PG14 receives the output signal of the sixth inverter IV16 at the first control terminal, the first chip fuse signal SLICE_fuse<0> at the second control terminal, and the address-setting-start-pulse addset_start at the input terminal. The first designating address addset0<0> of the first set of designating addresses addset0<0:4> is outputted from a node to which the third pass gate PG13 and the fourth pass gate PG14 are coupled.

Figure 5:
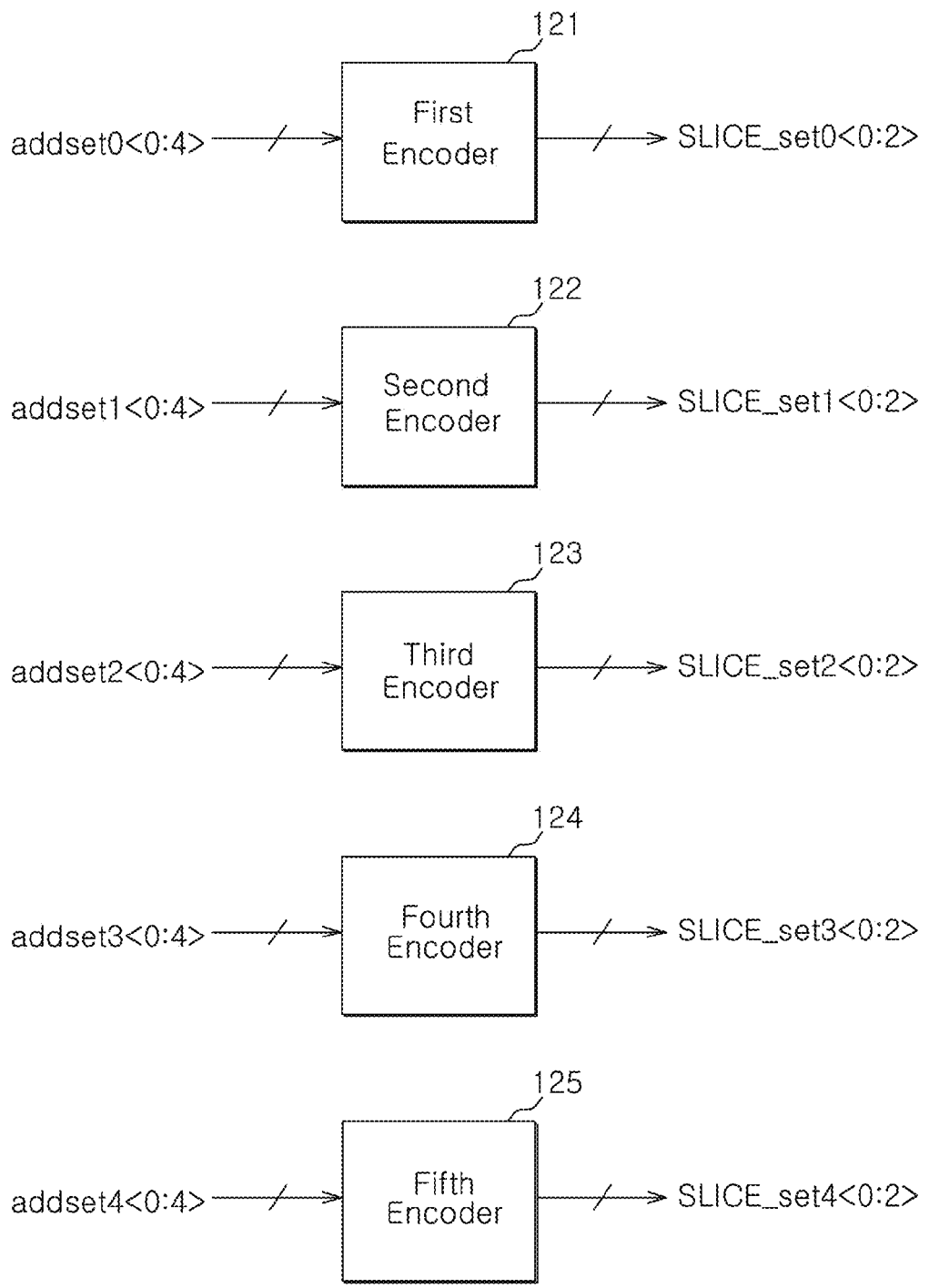
FIG. 5 is a diagram illustrating the configuration of the encoding unit shown in FIG. 2.

Referring to FIG. 5, the encoding unit 120 shown in FIG. 2 includes first through fifth encoders 121 through 125.

The first encoder 121 is configured to encode the first set of designating addresses addset0<0:4> and to generate the first individual-chip-designating-codes SLICE_set0<0:2>.

The second encoder 122 is configured to encode the second set of designating addresses addset1<0:4> and to generate the second individual-chip-designating-codes SLICE_set1<0:2>.

The third encoder 123 is configured to encode the third set of designating addresses addset2<0:4> and to generate the third individual-chip-designating-codes SLICE_set2<0:2>.

The fourth encoder 124 is configured to encode the fourth set of designating addresses addset3<0:4> and to generate the fourth individual-chip-designating-codes SLICE_set3<0:2>.

The fifth encoder 125 is configured to encode the fifth set of designating addresses addset4<0:4> and to generate the fifth individual-chip-designating-codes SLICE_set4<0:2>.

Figure 6:
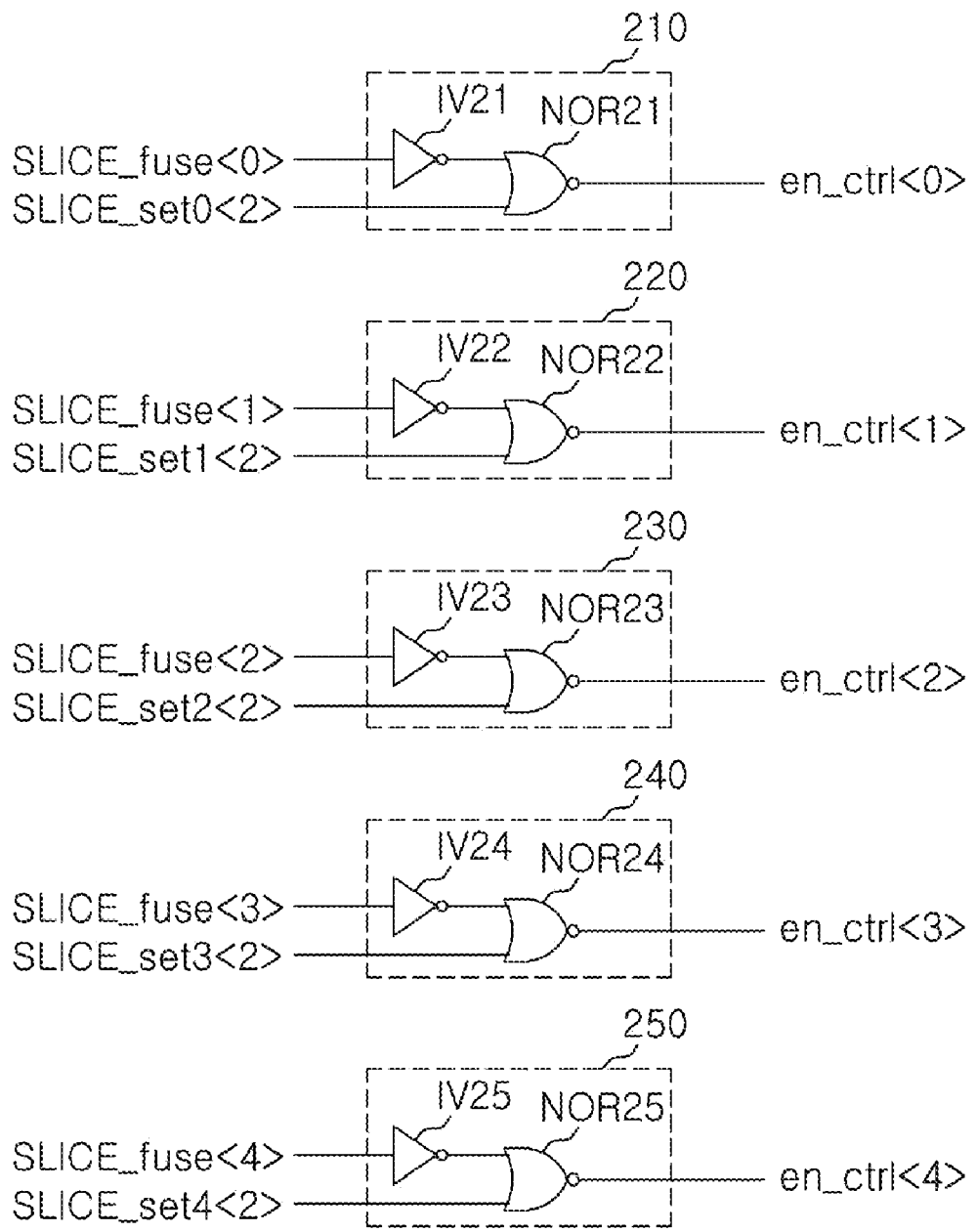
FIG. 6 is a diagram illustrating the configuration of the control block shown in FIG. 1.

Referring to FIG. 6, the control block 200 shown in FIG. 1 includes first through fifth enable control signal generation units 210 through 250.

The first enable-control-signal-generation-unit 210 is configured to disable the first enable control signal en_ctrl<0>, when the first chip fuse signal SLICE_fuse<0> is disabled to the low level or when the most significant bit SLICE_set0<2> of the first individual-chip-designating-codes SLICE_set0<0:2> has a particular level, or, specifically, a high level. Also, the first enable-control-signal-generation-unit 210 is configured to enable the first enable control signal en_ctrl<0>, when the first chip fuse signal SLICE_fuse<0> is enabled to the high level and the most significant bit SLICE_set0<2> of the first individual-chip-designating-codes SLICE_set0<0:2> has the opposite level, or, specifically, a low level.

The first enable-control-signal-generation-unit 210 includes a seventh inverter IV21, and a first NOR gate NOR21. The seventh inverter IV21 receives the first chip fuse signal SLICE_fuse<0>. The first NOR gate NOR21 receives the output signal of the seventh inverter IV21 and the most significant bit SLICE_set0<2> of the first individual-chip-designating-codes SLICE_set0<0:2>, and outputs the first enable control signal en_ctrl<0>.

The second enable-control-signal-generation-unit 220 is configured to disable the second enable control signal en_ctrl<1>, when the second chip fuse signal SLICE_fuse<1> is disabled to a low level or when the most significant bit SLICE_set1<2> of the second individual-chip-designating-codes SLICE_set1<0:2> has a particular level, or, specifically, a high level. Also, the second enable-control-signal-generation-unit 220 is configured to enable the second enable control signal en_ctrl<1>, when the second chip fuse signal SLICE_fuse<1> is enabled to a high level and the most significant bit SLICE_set1<2> of the second individual-chip-designating-codes SLICE_set1<0:2> has the opposite level, or, specifically, a low level.

The second enable-control-signal-generation-unit 220 includes an eighth inverter IV22, and a second NOR gate NOR22. The eighth inverter IV22 receives the second chip fuse signal SLICE_fuse<1>. The second NOR gate NOR22 receives the output signal of the eighth inverter IV22 and the most significant bit SLICE_set1<2> of the second individual-chip-designating-codes SLICE_set1<0:2>, and outputs the second enable control signal en_ctrl<1>.

The third enable-control-signal-generation-unit 230 is configured to disable the third enable control signal en_ctrl<2>, when the third chip fuse signal SLICE_fuse<2> is disabled to a low level or when the most significant bit SLICE_set2<2> of the third individual-chip-designating-codes SLICE_set2<0:2> has a particular level, or, specifically, a high level. Also, the third enable-control-signal-generation-unit 230 is configured to enable the third enable control signal en_ctrl<2> when the third chip fuse signal SLICE_fuse<2> is enabled to a high level and the most significant bit SLICE_set2<2> of the third individual-chip-designating-codes SLICE_set2<0:2> has the opposite level, or, specifically, a low level.

The third enable-control-signal-generation-unit 230 includes a ninth inverter IV23, and a third NOR gate NOR23. The ninth inverter IV23 receives the third chip fuse signal SLICE_fuse<2>. The third NOR gate NOR23 receives the output signal of the ninth inverter IV23 and the most significant bit SLICE_set2<2> of the third individual-chip-designating-codes SLICE_set2<0:2>, and outputs the third enable control signal en_ctrl<2>.

The fourth enable-control-signal-generation-unit 240 is configured to disable the fourth enable control signal en_ctrl<3>, when the fourth chip fuse signal SLICE_fuse<3> is disabled to a low level or when the most significant bit SLICE_set3<2> of the fourth individual-chip-designating-codes SLICE_set3<0:2> has a particular level, or, specifically, a high level. Also, the fourth enable-control-signal-generation-unit 240 is configured to enable the fourth enable control signal en_ctrl<3> when the fourth chip fuse signal SLICE_fuse<3> is enabled to a high level and the most significant bit SLICE_set3<2> of the fourth individual-chip-designating-codes SLICE_set3<0:2> has the opposite level, or, specifically, a low level.

The fourth enable-control-signal-generation-unit 240 includes a tenth inverter IV24, and a fourth NOR gate NOR24. The tenth inverter IV24 receives the fourth chip fuse signal SLICE_fuse<3>. The forth NOR gate NOR24 receives the output signal of the tenth inverter IV24 and the most significant bit SLICE_set3<2> of the fourth individual-chip-designating-codes SLICE_set3<0:2>, and outputs the fourth enable control signal en_ctrl<3>.

The fifth enable-control-signal-generation-unit 250 is configured to disable the fifth enable control signal en_ctrl<4>, when the fifth chip fuse signal SLICE_fuse<4> is disabled to a low level or when the most significant bit SLICE_set4<2> of the fifth individual-chip-designating-codes SLICE_set4<0:2> has a particular level, or, specifically, a high level. Also, the fifth enable-control-signal-generation-unit 250 is configured to enable the fifth enable control signal en_ctrl<4> when the fifth chip fuse signal SLICE_fuse<4> is enabled to a high level and the most significant bit SLICE_set4<2> of the fifth individual-chip-designating-codes SLICE_set4<0:2> has the opposite level, or, specifically, a low level.

The fifth enable-control-signal-generation-unit 250 includes an eleventh inverter IV25, and a fifth NOR gate NOR25. The eleventh inverter IV25 receives the fifth chip fuse signal SLICE_fuse<4>. The fifth NOR gate NOR25 receives the output signal of the eleventh inverter IV25 and the most significant bit SLICE_set4<2> of the fifth individual-chip-designating-codes SLICE_set4<0:2>, and outputs the fifth enable control signal en_ctrl<4>.

Figure 7:
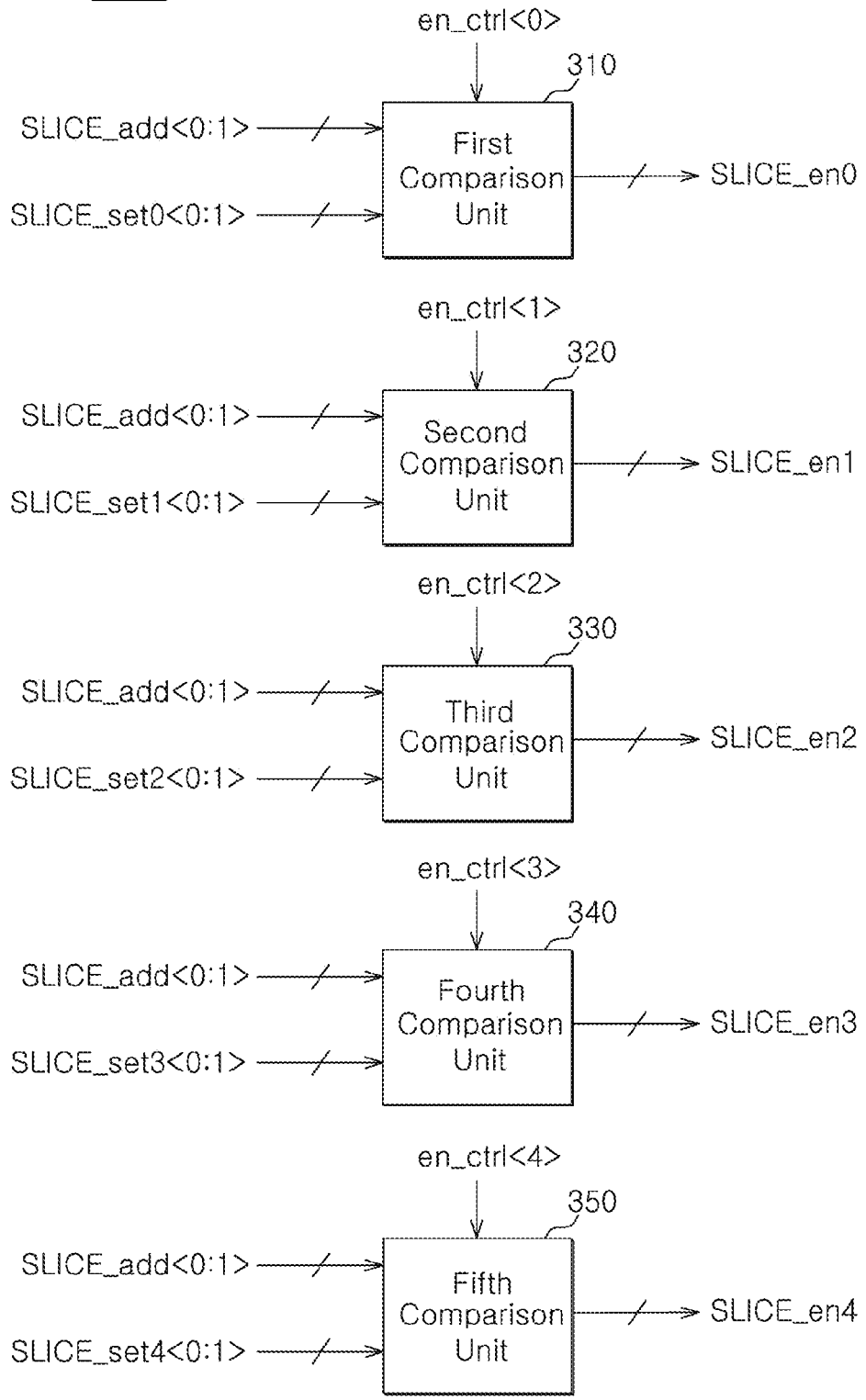
FIG. 7 is a diagram illustrating the configuration of the individual chip activation block shown in FIG. 1.

Referring to FIG. 7, the individual chip activation block 300 shown in FIG. 1 includes first through fifth comparison units 310 through 350.

The first comparison unit 310 is configured to enable the first individual-chip-activation-signal SLICE_en0 if the chip selection addresses SLICE_add<0:1> and the first individual-chip-designating-codes SLICE_set0<0:1> excluding the most significant bit SLICE_set0<2> are the same when the first enable control signal en_ctrl<0> is enabled, and disable the first individual-chip-activation-signal SLICE_en0 regardless of the chip selection addresses SLICE_add<0:1> and the first individual-chip-designating-codes SLICE_set0<0:1> excluding the most significant bit SLICE_set0<2> when the first enable control signal en_ctrl<0> is disabled.

The second comparison unit 320 is configured to enable the second individual-chip-activation-signal SLICE_en1 if the chip selection addresses SLICE_add<0:1> and the second individual-chip-designating-codes SLICE_set1<0:1> excluding the most significant bit SLICE_set1<2> are the same when the second enable control signal en_ctrl<1> is enabled, and disable the second individual-chip-activation-signal SLICE_en1 regardless of the chip selection addresses SLICE_add<0:1> or the second individual-chip-designating-codes SLICE_set1<0:1> excluding the most significant bit SLICE_set1<2> when the second enable control signal en_ctrl<1> is disabled.

The third comparison unit 330 is configured to enable the third individual-chip-activation-signal SLICE_en2 if the chip selection addresses SLICE_add<0:1> and the third individual-chip-designating-codes SLICE_set2<0:1> excluding the most significant bit SLICE_set2<2> are the same when the third enable control signal en_ctrl<2> is enabled, and disable the third individual-chip-activation-signal SLICE_en2 regardless of the chip selection addresses SLICE_add<0:1> or the third individual-chip-designating-codes SLICE_set2<0:1> excluding the most significant bit SLICE_set2<2> when the third enable control signal en_ctrl<2> is disabled.

The fourth comparison unit 340 is configured to enable the fourth individual-chip-activation-signal SLICE_en3 if the chip selection addresses SLICE_add<0:1> and the fourth individual-chip-designating-codes SLICE_set3<0:1> excluding the most significant bit SLICE_set3<2> are the same when the fourth enable control signal en_ctrl<3> is enabled, and disable the fourth individual-chip-activation-signal SLICE_en3 regardless of the chip selection addresses SLICE_add<0:1> or the fourth individual-chip-designating-codes SLICE_set3<0:1> excluding the most significant bit SLICE_set3<2> when the fourth enable control signal en_ctrl<3> is disabled.

The fifth comparison unit 350 is configured to enable the fifth individual-chip-activation-signal SLICE_en4 if the chip selection addresses SLICE_add<0:1> and the fifth individual-chip-designating-codes SLICE_set4<0:1> excluding the most significant bit SLICE_set4<2> are the same when the fifth enable control signal en_ctrl<4> is enabled, and disable the fifth individual-chip-activation-signal SLICE_en4 regardless of the chip selection addresses SLICE_add<0:1> or the fifth individual-chip-designating-codes SLICE_set4<0:1> excluding the most significant bit SLICE_set4<2> when the fifth enable control signal en_ctrl<4> is disabled.

The semiconductor apparatus in accordance with an embodiment of the present invention, configured as mentioned above, operates as described below.

The semiconductor apparatus in accordance with an embodiment of the present invention is assumed to be a semiconductor apparatus in which five chips (first through fifth individual chips) are stacked. The first individual chip is activated if the first individual-chip-activation-signal SLICE_en0 is enabled; the second individual chip is activated if the second individual-chip-activation-signal SLICE_en1 is enabled; the third individual chip is activated if the third individual-chip-activation-signal SLICE_en2 is enabled; the fourth individual chip is activated if the fourth individual-chip-activation-signal SLICE_en3 is enabled; and the fifth individual chip is activated if the fifth individual-chip-activation-signal SLICE_en4 is enabled.

For example, if a failure does not occur in the first through fifth individual chips, all of the first through fifth chip fuse signals SLICE_fuse<0:4> are enabled.

If all the first through fifth chip fuse signals SLICE_fuse<0:4> are enabled, the individual-chip-designating-code setting block 100 generates the first through fifth individual-chip-designating-codes SLICE_set0<0:2>, SLICE_set1<0:2>, SLICE_set2<0:2>, SLICE_set3<0:2> and SLICE_set4<0:2>, all having different values.

A process for generating the first through fifth individual-chip-designating-codes SLICE_set0<0:2>, SLICE_set1<0:2>, SLICE_set2<0:2>, SLICE_set3<0:2> and SLICE_set4<0:2> is described in detail with reference to FIGS. 2 and 3.

When all of the first through fifth chip fuse signals SLICE_fuse<0:4> are enabled, the address-setting-start-pulse addset_start is inputted, and five cycles of the clock CLK elapse.

address-setting-start-pulse addset_start is outputted as the fifth designating address addset0<4> of the first set of designating addresses addset0<0:4> when the five cycles of the clock CLK have elapsed. Accordingly, the first set of designating addresses addset0<0:4> becomes '00001'.

The first designating address addset0<0> of the first set of designating addresses addset0<0:4> is outputted as the fourth designating address addset1<3> of the second set of designating addresses addset1<0:4> when the five cycles of the clock CLK elapse after the address-setting-start-pulse addset_ start is inputted. Accordingly, the second set of designating addresses addset1<0:4> becomes '00010'.

The first designating address addset1<0> of the second set of designating addresses addset1<0:4> is outputted as the third designating address addset2<2> of the third set of designating addresses addset2<0:4> when the five cycles of the clock CLK to elapses after the address-setting-start-pulse addset_start is inputted. Accordingly, the third set of designating addresses addset2<0:4> becomes '00100'.

The first designating address addset2<0> of the third set of designating addresses addset2<0:4> is outputted as the second designating address addset3<1> of the fourth set of designating addresses addset3<0:4> when the five cycles of the clock CLK elapse after the address-setting-start-pulse addset_ start is inputted. Accordingly, the fourth set of designating addresses addset3<0:4> becomes '01000'.

The first designating address addset3<0> of the fourth set of designating addresses addset3<0:4> is outputted as the first designating address addset4<0> of the fifth set of designating addresses addset4<0:4> when the five cycles of the clock CLK elapse after the address-setting-start-pulse addset_start is inputted. Accordingly, the fifth set of designating addresses addset4<0:4> becomes '10000'.

As the first set of designating addresses addset0<0:4> having a value of '00001' is encoded, the first individual-chip-designating-codes SLICE_set0<0:2> having a value of '000' are generated.

As the second set of designating addresses addset1<0:4> having a value of '00010' is encoded, the second individual-chip-designating-codes SLICE_set1<0:2> having a value of '001' are generated.

As the third set of designating addresses addset2<0:4> having a value of '00100' is encoded, the third individual-chip-designating-codes SLICE_set2<0:2> having a value of '010' are generated.

As the fourth set of designating addresses addset3<0:4> is having a value of '01000' is encoded, the fourth individual-chip-designating-codes SLICE_set3<0:2> having a value of '011' are generated.

As the fifth set of designating addresses addset4<0:4> having a value of '10000' is encoded, the fifth individual-chip-designating-codes SLICE_set4<0:2> having a value of '100' are generated.

A process for generating the first through fifth enable control signals en_ctrl<0:4> is described with reference to FIGS. 1 and 6.

Since the first chip fuse signal SLICE_fuse<0> is enabled to the high level and the most significant bit SLICE_set0<2> of the first individual-chip-designating-codes SLICE_set0<0:2> has the low level, the first enable control signal en_ctrl<0> is enabled to the high level.

Since the second chip fuse signal SLICE_fuse<1> is enabled to the high level and the most significant bit SLICE_set1<2> of the second individual-chip-designating-codes SLICE_set1<0:2> has the low level, the second enable control signal en_ctrl<1> is enabled to the high level.

Since the third chip fuse signal SLICE_fuse<2> is enabled to the high level and the most significant bit SLICE_set2<2> of the third individual-chip-designating-codes SLICE_set2<0:2> has the low level, the third enable control signal en_ctrl<2> is enabled to the high level.

Since the fourth chip fuse signal SLICE_fuse<3> is enabled to the high level and the most significant bit SLICE_set3<2> of the fourth individual-chip-designating-codes SLICE_set3<0:2> has the low level, the fourth enable control signal en_ctrl<3> is enabled to the high level.

Since the fifth chip fuse signal SLICE_fuse<4> is enabled to the high level and the most significant bit SLICE_set4<2> of the fifth individual-chip-designating-codes SLICE_set4<0:2> has the high level, the fifth enable control signal en_ctrl<4> is disabled to the low level.

Therefore, among the first through fifth enable control signals en_ctrl<0:4>, only the fifth enable control signal en_ctrl<4> is disabled, and all the remaining enable control signals en_ctrl<0:3> are enabled. Hence, among the first through fifth comparison units 310 through 350 shown in FIG. 7, the first through fourth comparison units 310 through 340 are activated, and the fifth comparison unit 350 is deactivated.

As a result, in the semiconductor apparatus in accordance with an embodiment of the present invention, when all the first through fifth chip fuse signals SLICE_fuse<0:4> are enabled, the individual-chip-designating-codes SLICE_set0<0:1>, SLICE_set1<0:1>, SLICE<set2<0:1> and SLICE_set3<0:1> of the first through fourth individual-chip-designating-codes SLICE_set0<0:2>, SLICE_set1<0:2>, SLICE_set2<0:2> and SLICE_set3<0:2> excluding the most significant bits SLICE_set0<2>, SLICE_set1<2>, SLICE_set2<2> and SLICE_set3<2> are compared with the chip selection addresses SLICE_add<0:1>, and one of the first through fourth individual-chip-activation-signals SLICE_en0 through SLICE_en3 is selectively enabled. The fifth individual-chip-activation-signal SLICE_en4 is disabled regardless of the chip selection address SLICE_add<0:1> or the fifth individual-chip-designating-codes SLICE_set4<0:2>.

The operation of the semiconductor apparatus in accordance with an embodiment of the present invention when a failure occurs in one individual chip among the first through fourth individual chips will be described below. For example, when a failure occurs in the second individual chip, the second chip fuse signal SLICE_fuse<1> among the first through fifth chip fuse signals SLICE_fuse<0:4> is disabled, and the remaining chip fuse signals SLICE_fuse<0> and SLICE_fuse<2:4> are enabled.

If only the second chip fuse signal SLICE_fuse<1> is disabled among the first through fifth chip fuse signals SLICE_fuse<0:4>, the first individual-chip-designating-codes SLICE_set0<0:2> become '000'; the second individual-chip-designating-codes SLICE_set1<0:2> become '000'; the third individual-chip-designating-codes SLICE_set2<0:2> become '001'; the fourth individual-chip-designating-codes SLICE_set3<0:2> become '010'; and the fifth individual-chip-designating-codes SLICE_set4<0:2> become '011'. The values of the first through fifth individualchip-designating-codes SLICE_set0<0:2>, SLICE_set1<0:2>, SLICE_set2<0:2>, SLICE_set3<0:2> and SLICE_set4<0:2> are set as described above, because the first set of designating addresses addset0<0:4> is set to '00001' and encoded, the second set of designating addresses addset1<0:4> is set to '00001' and encoded, the third set of designating addresses addset2<0:4> is set to '00010' and encoded, the fourth set of designating addresses addset3<0:4> is set to '00100' and encoded, and the fifth set of designating addresses addset4<0:4> is set to '01000' and encoded.

Among the first through fifth enable control signals en_ctrl<0:4>, the second enable control signal en_ctrl<1> is disabled by the disabled second chip fuse signal SLICE_fuse<1>, and the remaining enable control signals en_ctrl<0> and en_ctrl<2:4> are enabled.

Accordingly, among the first through fifth comparison units 310 through 350, only the second comparison unit 320 is deactivated, and the remaining comparison units 310 and 330 through 350 are activated.

As a result, in the semiconductor apparatus in accordance with the embodiment of the present invention, the first individual-chip-designating-codes SLICE_set0<0:1> and the third through fifth individual-chip-designating-codes SLICE_set2<0:1>, SLICE_set3<0:1> and SLICE_set4<0:1> excluding the most significant bits thereof are compared with the chip selection addresses SLICE_add<0:1>, and one of the first individual-chip-activation-signal SLICE_en0 and the third through fifth individual-chip-activation-signals SLICE_en2 through SLICE_en4 is selectively is enabled.

In the semiconductor apparatus in accordance with an embodiment of the present invention, when all of the first through fifth chip fuse signals SLICE_fuse<0:4> are enabled, the first individual-chip-activation-signal SLICE_en0 is enabled if the chip selection addresses SLICE_add<0:1> are '00'; the second individual-chip-activation-signal SLICE_en1 is enabled if the chip selection addresses SLICE_add<0:1> are '01'; the third individual-chip-activation-signal SLICE_en2 is enabled if the chip selection addresses SLICE_add<0:1> are '10'; and the fourth individual-chip-activation-signal SLICE_en3 is enabled if the chip selection addresses SLICE_add<0:1> are '11'

Moreover, in the semiconductor apparatus in accordance with an embodiment of the present invention, when only the second chip fuse signal SLICE_fuse<1> is disabled among the first through fifth chip fuse signals SLICE_fuse<0:4>, the first individual-chip-activation-signal SLICE_en0 is enabled if the chip selection addresses SLICE_add<0:1> are '00'; the third individual-chip-activation-signal SLICE_en2 is enabled if the chip selection addresses SLICE_add<0:1> are '01'; the fourth individual-chip-activation-signal SLICE_en3 is enabled if the chip selection addresses SLICE_add<0:1> are '10'; and the fifth individual-chip-activation-signal SLICE_en4 is enabled if the chip selection addresses SLICE_add<0:1> are '11'.

In summary, in the semiconductor apparatus in accordance with an embodiment of the present invention in which a total of five individual chips are stacked, one individual chip among four individual chips is selected according to chip selection addresses. Only four of the total five individual chips are selected according to the chip selection addresses, and one serves as an extra individual chip.

If one of the four individual chips is selected according to the chip selection addresses and a failure occurs in one of the four individual chips, data is stored using the extra individual chip. Therefore, in the semiconductor apparatus in accordance with an embodiment of the present invention, data can be stored in the same number of individual chips regardless of whether a failed individual chip exists among the stacked individual chips. While in the illustrated and described semiconductor apparatus in accordance with the embodiment of the present invention, only one failed individual chip is replaced with the extra chip, a person having ordinary knowledge in the art will readily appreciate that, when failure occurs in two or more individual chips, the failed individual chips can be replaced with extra individual chips of the same number as the failed individual chips.

While certain embodiments have been described above, those skilled in the art will understand that the embodiments described are examples only. Accordingly, the semiconductor apparatus described herein should not be limited based on the described embodiment. Rather, the semiconductor apparatus described herein should only be limited in light of the claims that is follow when taken in conjunction with the above description and accompanying drawings.

What is claimed is:

1. A semiconductor apparatus comprising:
   an individual-chip-designating-code setting block configured to generate a plurality of sets of individual-chip-designating-codes, which have different code values or of which at least two sets of individual-chip-designating-codes have the same code value, in response to a plurality of chip fuse signals;
   a control block configured to generate a plurality of enable control signals in response to the plurality of chip fuse signals and most significant bits of the plurality of sets of individual-chip-designating-codes; and
   an individual chip activation block configured to compare individual-chip-designating-codes of the plurality of sets of individual-chip-designating-codes excluding the most significant bits, with chip selection addresses in response to the plurality of enable control signals, and enable one of a plurality of individual-chip-activation-signals depending upon a comparison result.

2. The semiconductor apparatus according to claim 1,
   wherein the individual-chip-designating-code setting block is configured to generate the plurality of sets of individual-chip-designating-codes which have sequentially increasing code values, when each of the plurality of chip fuse signals is enabled, and
   wherein the individual-chip-designating-code setting block is configured to determine the number of sets of individual-chip-designating-codes which have the same code value, in response to a disabled chip fuse signal among the plurality of chip fuse signals.

3. The semiconductor apparatus according to claim 2,
   wherein the plurality of sets of individual-chip-designating-codes include first through fifth sets of individual-chip-designating-codes, and the plurality of chip fuse signals include first through fifth chip fuse signals, and
   wherein the individual-chip-designating-code setting block initializes the first set of individual-chip-designating-codes when the first chip fuse signal is disabled, generates the second set of individual-chip-designating-codes which has the same code value as the first set of individual-chip-designating-codes when the second is chip fuse signal is disabled, generates the third set of individual-chip-designating-codes which has the same code value as the second set of individual-chip-designating-codes when the third chip fuse signal is disabled, generates the fourth set of individual-chip-designating-codes which has the same code value as the third set of individual-chip-designating-codes when the fourth chip fuse signal is disabled, and generates the fifth set of individual-chip-designating-codes which has the same code value as the fourth set of individual-chip-designating-codes when the fifth chip fuse signal is disabled.

4. The semiconductor apparatus according to claim 3, wherein the individual-chip-designating-code setting block comprises:
   an individual-chip-designating-address setting unit configured to generate first through fifth sets of designating addresses in response to the first through fifth chip fuse signals; and
   an encoding unit configured to encode the first through fifth sets of designating addresses and generate the first through fifth sets of individual-chip-designating-codes.

5. The semiconductor apparatus according to claim 4, wherein the individual-chip-designating-address setting unit generates the first through fifth sets of designating addresses which have different values when each of the first through fifth chip fuse signals is enabled, initializes the first set of designating addresses when the first chip fuse signal is disabled, generates the second set of designating addresses which has the same value as the first set of designating addresses when the second chip fuse signal is disabled, generates the third set of designating addresses which has the same value as the second set of designating addresses when the third chip fuse signal is disabled, generates the fourth set of designating addresses which has the same value as the third set of designating addresses when the fourth chip fuse signal is disabled, and generates the fifth set of designating addresses which has the same value as the fourth set of designating addresses when the fifth chip fuse signal is disabled.

6. The semiconductor apparatus according to claim 5, wherein the individual-chip-designating-address setting unit comprises:
   a first designating-address-set-generation-section configured to generate the first set of designating addresses in response to the first chip fuse signal;
   a second designating-address-set-generation-section configured to generate the second set of designating addresses in response to the second chip fuse signal;
   a third designating-address-set-generation-section configured to generate the third set of designating addresses in response to the third chip fuse signal;
   a fourth designating-address-set-generation-section configured to generate the fourth set of designating addresses in response to the fourth chip fuse signal; and
   a fifth designating-address-set-generation-section configured to generate the fifth set of designating addresses in response to the fifth chip fuse signal.

7. The semiconductor apparatus according to claim 6, wherein the first designating-address-set-generation-section comprises:
   a first output selection flip-flop configured to transmit an address-setting-start-pulse as a first designating address of the first set of designating addresses or transmit the address-setting-start-pulse as the first designating address of the first set of designating addresses after one cycle of a clock, in response to the address-setting-start-pulse and the first chip fuse signal;
   a first flip-flop configured to receive an output of the first output selection flip-flop and transmit the received output as a second designating address of the first set of designating addresses after one cycle of the clock;
   a second flip-flop configured to receive an output of the first flip-flop and transmit the received output as a third designating address of the first set of designating addresses after one cycle of the clock;
   a third flip-flop configured to receive an output of the second flip-flop and transmit the received output as a fourth designating address of the first set of designating addresses after one cycle of the is clock; and
   a fourth flip-flop configured to receive an output of the third flip-flop and transmit the received output as a fifth designating address of the first set of designating addresses after one cycle of the clock.

8. The semiconductor apparatus according to claim 7, wherein the second designating-address-set-generation-section comprises:
   a second output selection flip-flop configured to transmit an output of the first output selection flip-flop as a first designating address of the second set of designating addresses or transmit the output of the first output selection flip-flop as the first designating address of the second set of designating addresses after one cycle of the clock, in response to the second chip fuse signal;
   a fifth flip-flop configured to receive an output of the second output selection flip-flop and transmit the received output as a second designating address of the second set of designating addresses after one cycle of the clock;
   a sixth flip-flop configured to receive an output of the fifth flip-flop and transmit the received output as a third designating address of the second set of designating addresses after one cycle of the clock;
   a seventh flip-flop configured to receive an output of the sixth flip-flop and transmit the received output as a fourth designating is address of the second set of designating addresses after one cycle of the clock; and
   an eighth flip-flop configured to receive an output of the seventh flip-flop and transmit the received output as a fifth designating address of the second set of designating addresses after one cycle of the clock.

9. The semiconductor apparatus according to claim 8, wherein the third designating-address-set-generation-section comprises:
   a third output selection flip-flop configured to transmit an output of the second output selection flip-flop as a first designating address of the third set of designating addresses or transmit the output of the second output selection flip-flop as the first designating address of the third set of designating addresses after one cycle of the clock, in response to the third chip fuse signal;
   a ninth flip-flop configured to receive an output of the third output selection flip-flop and transmit the received output as a second designating address of the third set of designating addresses after one cycle of the clock;
   a tenth flip-flop configured to receive an output of the ninth flip-flop and transmit the received output as a third designating address of the third set of designating addresses after one cycle of the clock;
   an eleventh flip-flop configured to receive an output of the tenth flip-flop and transmit the received output as a fourth designating address of the third set of designating addresses after one cycle of the clock; and
   a twelfth flip-flop configured to receive an output of the eleventh flip-flop and transmit the received output as a fifth designating address of the third set of designating addresses after one cycle of the clock.

10. The semiconductor apparatus according to claim 9, wherein the fourth designating-address-set-generation-section comprises:
    a fourth output selection flip-flop configured to transmit an output of the third output selection flip-flop as a first designating address of the fourth set of designating addresses or transmit the output of the third output selection flip-flop as the first designating address of the fourth set of designating addresses after one cycle of the clock, in response to the fourth chip fuse signal;
a thirteenth flip-flop configured to receive an output of the fourth output selection flip-flop and transmit the received output as a second designating address of the fourth set of designating addresses after one cycle of the clock;
a fourteenth flip-flop configured to receive an output of the thirteenth flip-flop and transmit the received output as a third designating address of the fourth set of designating addresses after one cycle of the clock;
a fifteenth flip-flop configured to receive an output of the fourteenth flip-flop and transmit the received output as a fourth designating address of the fourth set of designating addresses after one cycle of the clock; and
a sixteenth flip-flop configured to receive an output of the fifteenth flip-flop and transmit the received output as a fifth designating address of the fourth set of designating addresses after one cycle of the clock.

11. The semiconductor apparatus according to claim 10, wherein the fifth designating-address-set-generation-section comprises:
a fifth output selection flip-flop configured to transmit an output of the fourth output selection flip-flop as a first designating address of the fifth set of designating addresses or transmit the output of the fourth output selection flip-flop as the first designating address of the fifth set of designating addresses after one cycle of the clock, in response to the fifth chip fuse signal;
a seventeenth flip-flop configured to receive an output of the fifth output selection flip-flop and transmit the received output as a second designating address of the fifth set of designating addresses after one cycle of the clock;
an eighteenth flip-flop configured to receive an output of the seventeenth flip-flop and transmit the received output as a third designating address of the fifth set of designating addresses after one is cycle of the clock;
a nineteenth flip-flop configured to receive an output of the eighteenth flip-flop and transmit the received output as a fourth designating address of the fifth set of designating addresses after one cycle of the clock; and
a twentieth flip-flop configured to receive an output of the nineteenth flip-flop and transmit the received output as a fifth designating address of the fifth set of designating addresses after one cycle of the clock.

12. The semiconductor apparatus according to claim 4, wherein the encoding unit comprises:
a first encoder configured to encode the first set of designating addresses and generate the first set of individual-chip-designating-codes;
a second encoder configured to encode the second set of designating addresses and generate the second set of individual-chip-designating-codes;
a third encoder configured to encode the third set of designating addresses and generate the third set of individual-chip-designating-codes;
a fourth encoder configured to encode the fourth set of designating addresses and generate the fourth set of individual-chip-designating-codes; and
a fifth encoder configured to encode the fifth set of designating is addresses and generate the fifth set of individual-chip-designating-codes.

13. The semiconductor apparatus according to claim 3, wherein the plurality of enable control signals include first through fifth enable control signals, and
wherein the control block comprises:
a first enable-control-signal-generation-unit configured to disable the first enable control signal when the first chip fuse signal is disabled or the most significant bit of the first set of individual-chip-designating-codes has a specified level;
a second enable-control-signal-generation-unit configured to disable the second enable control signal when the second chip fuse signal is disabled or the most significant bit of the second set of individual-chip-designating-codes has the specified level;
a third enable-control-signal-generation-unit configured to disable the third enable control signal when the third chip fuse signal is disabled or the most significant bit of the third set of individual-chip-designating-codes has the specified level;
a fourth enable-control-signal-generation-unit configured to disable the fourth enable control signal when the fourth chip fuse signal is disabled or the most significant bit of the fourth set of individual-chip-designating-codes has the specified level; and
a fifth enable-control-signal-generation-unit configured to disable the fifth enable control signal when the fifth chip fuse signal is disabled or the most significant bit of the fifth set of individual-chip-designating-codes has the specified level.

14. The semiconductor apparatus according to claim 13,
wherein the first enable-control-signal-generation-unit is configured to enable the first enable control signal when the first chip fuse signal is enabled and the most significant bit of the first set of individual-chip-designating-codes has a level opposite to the specified level,
wherein the second enable-control-signal-generation-unit is configured to enable the second enable control signal when the second chip fuse signal is enabled and the most significant bit of the second set of individual-chip-designating-codes has a level opposite to the specified level,
wherein the third enable-control-signal-generation-unit is configured to enable the third enable control signal when the third chip fuse signal is enabled and the most significant bit of the third set of individual-chip-designating-codes has a level opposite to the specified level,
wherein the fourth enable-control-signal-generation-unit is configured to enable the fourth enable control signal when the fourth chip fuse signal is enabled and the most significant bit of the fourth set of individual-chip-designating-codes has a level opposite to the specified level, and
wherein the fifth enable-control-signal-generation-unit is configured to enable the fifth enable control signal when the fifth chip fuse signal is enabled and the most significant bit of the fifth set of individual-chip-designating-codes has a level opposite to the specified level.

15. The semiconductor apparatus according to claim 13,
wherein the plurality of individual-chip-activation-signals include first through fifth individual-chip-activation-signals, and
wherein the individual chip activation block comprises:
a first comparison unit configured to generate the first individual-chip-activation-signal in response to the first enable control signal, the chip selection addresses and the individual-chip-designating-codes of the first set of individual-chip-designating-codes excluding the most significant bit;
a second comparison unit configured to generate the second individual-chip-activation-signal in response to the second enable control signal, the chip selection addresses and the individual-chip-designating-codes of the second set of individual-chip-designating-codes excluding the most significant bit;

a third comparison unit configured to generate the third individual-chip-activation-signal in response to the third enable control signal, the chip selection addresses and the individual-chip-designating-codes of the third set of individual-chip-designating-codes excluding the most significant bit;

a fourth comparison unit configured to generate the fourth individual-chip-activation-signal in response to the fourth enable control signal, the chip selection addresses and the individual-chip-designating-codes of the fourth set of individual-chip-designating-codes excluding the most significant bit; and a fifth comparison unit configured to generate the fifth individual-chip-activation-signal in response to the fifth enable control signal, the chip selection addresses and the individual-chip-designating-codes of the fifth set of individual-chip-designating-codes excluding the most significant bit.

16. The semiconductor apparatus according to claim 15, wherein the first comparison unit enables the first individual-chip-activation-signal if the chip selection addresses and the individual-chip-designating-codes of the first set of individual-chip-designating-codes excluding the most significant bit are the same when the first enable control signal is enabled, wherein the second comparison unit enables the second individual-chip-activation-signal if the chip selection addresses and the individual-chip-designating-codes of the second set of individual-chip-designating-codes excluding the most significant bit are the same when the second enable control signal is enabled, wherein the third comparison unit enables the third individual-chip-activation-signal if the chip selection addresses and the individual-chip-designating-codes of the third set of individual-chip-designating-codes excluding the most significant bit are the same when the third enable control signal is enabled, wherein the fourth comparison unit enables the fourth individual-chip-activation-signal if the chip selection addresses and the individual-chip-designating-codes of the fourth set of individual-chip-designating-codes excluding the most significant bit are the same when the fourth enable control signal is enabled, and wherein the fifth comparison unit enables the fifth individual-chip-activation-signal if the chip selection addresses and the individual-chip-designating-codes of the fifth set of individual-chip-designating-codes excluding the most significant bit are the same when the fifth enable control signal is enabled.

17. A semiconductor apparatus suitable for generating a first set of individual-chip-designating-codes, a second set of individual-chip-designating-codes, a third set of individual-chip-designating-codes, a fourth set of individual-chip-designating-codes, a first individual-chip-activation-signal, a second individual-chip-activation-signal, a third individual-chip-activation-signal and a fourth individual-chip-activation-signal, comparing the first through third sets of individual-chip-designating-codes with chip selection addresses when a chip fuse signal is enabled, and enabling one of the first through third individual-chip-activation-signals, the semiconductor apparatus comprising:

an individual-chip-designating-code setting block configured to generate the second set of individual-chip-designating-codes to have the same code value as the first set of individual-chip-designating-codes when the chip fuse signal is disabled; and an individual chip activation block configured to compare the first set of individual-chip-designating-codes, the third set of individual-chip-designating-codes and the fourth set of individual-chip-designating-codes with the chip selection addresses when the individual-chip-designating-code setting block generates the second set of individual-chip-designating-codes to have the same code value as the first set of individual-chip-designating-codes, and enable one of the first individual-chip-activation-signal, the third individual-chip-activation-signal and the fourth individual-chip-activation-signal.

18. The semiconductor apparatus according to claim 17, wherein the individual-chip-designating-code setting block is configured such that the first through fourth sets of individual-chip-designating-codes have sequentially increasing code values when the chip fuse signal is enabled, and wherein the individual-chip-designating-code setting block is configured such that the first and second sets of individual-chip-designating-codes have the same code value and the first set of individual-chip-designating-codes, the third set of individual-chip-designating-codes and the fourth set of individual-chip-designating-codes have sequentially increasing code values when the chip fuse signal is disabled.

19. The semiconductor apparatus according to claim 18, wherein the individual-chip-designating-code setting block comprises:

an individual-chip-designating-address setting unit configured to generate first through fourth sets of designating addresses in response to the chip fuse signal when an address-setting-start-pulse is inputted and a predetermined cycle of a clock elapses; and an encoding unit configured to encode the first through fourth sets of designating addresses and generate the first through fourth sets of individual-chip-designating-codes.

20. The semiconductor apparatus according to claim 19, wherein the individual-chip-designating-address setting unit comprises:

a first designating-address-set-generation-section having a first set of flip-flops which are coupled in series, a first flip-flop of the first set of flip-flops coupled in series configured to receive the address-setting-start-pulse;

a second designating-address-set-generation-section having an output selection flip-flop which transmits an output of the first flip-flop of the first set of flip-flops after one cycle of the clock when the chip fuse signal is enabled and transmits the output of the first flip-flop of the first set of flip-flops regardless of the clock when the chip fuse signal is disabled, and a second set of flip-flops which are coupled in series, a first flip-flop of the second set of flip-flops configured to receive an output of the output selection flip-flop;

a third designating-address-set-generation-section having a third set of flip-flops which are coupled in series, a first flip-flop of the third set of flip-flops coupled in series configured to receive the output of the output selection flip-flop; and a fourth designating-address-set-generation-section having a fourth set of flip-flops which are coupled in series, a first flip-flop of the fourth set of flip-flops coupled in series configured to receive an output of the first flip-flop of the third set of flip-flops.

21. The semiconductor apparatus according to claim 17,
wherein the individual chip activation block compares the first through third sets of individual-chip-designating-codes with the chip selection addresses when the individual-chip-designating-code setting block generates the second set of individual-chip-designating-codes to have a different code value from the first set of individual-chip-designating-codes, and selectively enables one of the first through third individual-chip-activation-signals, and
wherein the individual chip activation block compares the first set of individual-chip-designating-codes, the third set of individual-chip-designating-codes and the fourth set of individual-chip-designating-codes with the chip selection addresses when the individual-chip-designating-code setting block generates the second set of individual-chip-designating-codes to have the same code value as the first set of individual-chip-designating-codes, and selectively enables one of the first individual-chip-activation-signal, the third individual-chip-activation-signal and the fourth individual-chip-activation-signal.

22. The semiconductor apparatus according to claim 21,
wherein the individual chip activation block comprises:
a first comparison unit configured to enable the first individual-chip-activation-signal when the first set of individual-chip-designating-codes and the chip selection addresses are the same;
a second comparison unit configured to enable the second individual-chip-activation-signal when the second set of individual-chip-designating-codes and the chip selection addresses are the same;
a third comparison unit configured to enable the third individual-chip-activation-signal when the third set of individual-chip-designating-codes and the chip selection addresses are the same; and
a fourth comparison unit configured to enable the fourth individual-chip-activation-signal when the fourth set of individual-chip-designating-codes and the chip selection addresses are the same,
wherein the second comparison unit disables the second individual-chip-activation-signal regardless of the chip selection addresses when the individual-chip-designating-code setting block generates the second set of individual-chip-designating-codes to have the same code value as the first set of individual-chip-designating-codes, and
wherein the fourth comparison unit disables the fourth individual-chip-activation-signal regardless of the chip selection addresses when the individual-chip-designating-code setting block generates the second set of individual-chip-designating-codes to have a different code value from the first set of individual-chip-designating-codes.

* * * * *